US009753217B2

(12) United States Patent
Pitwon

(10) Patent No.: US 9,753,217 B2
(45) Date of Patent: Sep. 5, 2017

(54) STRESS RELIEF FOR ELECTRO-OPTICAL PRINTED CIRCUIT BOARD

(71) Applicant: Xyratex Technology Limited, Havant (GB)

(72) Inventor: Richard C. A. Pitwon, Fareham (GB)

(73) Assignee: XYRATEX TECHNOLOGY LIMITED, Havant (GB)

( * ) Notice: Subject to any disclaimer, the term of this patent is extended or adjusted under 35 U.S.C. 154(b) by 7 days.

(21) Appl. No.: 14/926,608

(22) Filed: Oct. 29, 2015

(65) Prior Publication Data

US 2017/0123149 A1 May 4, 2017

(51) Int. Cl.
*G02B 6/12* (2006.01)
*G02B 6/122* (2006.01)
*G02B 6/13* (2006.01)

(52) U.S. Cl.
CPC .......... *G02B 6/122* (2013.01); *G02B 6/12004* (2013.01); *G02B 6/13* (2013.01)

(58) Field of Classification Search
CPC ....... G02B 6/122; G02B 6/12004; G02B 6/13
USPC .......................................................... 385/14
See application file for complete search history.

(56) References Cited

U.S. PATENT DOCUMENTS

| 4,781,424 | A | 11/1988 | Kawachi et al. | |
|---|---|---|---|---|
| 7,936,953 | B2 | 5/2011 | Johnson et al. | |
| 2008/0232753 | A1* | 9/2008 | Fujii | G02B 6/138 385/126 |
| 2015/0333831 | A1* | 11/2015 | Lai | H04B 10/50 398/200 |

OTHER PUBLICATIONS

Pitwon et al., "Pluggable Electro-Optical Circuit Board Interconnect Based on Embedded Graded-Index Planar Glass Waveguides," Feb. 2015, *Journal of Lightwave Technology*; 33(4):741-754.

* cited by examiner

*Primary Examiner* — Jerry Blevins
(74) *Attorney, Agent, or Firm* — Mueting, Raasch & Gebhardt, P.A.

(57) ABSTRACT

Electro-optical circuit boards may include one or more recesses to provide stress relief between multiple layers of the electro-optical circuit boards during variations in applied temperature. The one or more recesses may be included in the substrate and/or the optical layer of the electro-optical circuit boards. The one or more recesses may also contain a compliant material disposed therein to improve the flexibility of the substrate and/or the optical layer. For example, the compliant material may disperse thermal expansion stress within the electro-optical circuit board.

20 Claims, 16 Drawing Sheets

STRESS RELIEF FOR ELECTRO-OPTICAL PRINTED CIRCUIT BOARD

The disclosure herein relates to systems, structures, apparatus, and methods including stress relief features within printed circuit boards.

SUMMARY

The present disclosure relates to an electro-optical circuit board that includes multiple layers bonded to one another having differing coefficients of thermal expansion. As the electro-optical circuit board heats up and cools down over the course of its lifetime (e.g., due to fabrication, normal operation, etc.) the various layers expand and contract at different rates to produce undesirable stress and strain on the electro-optical circuit board, and specifically, on the optical waveguide cores. The electro-optical circuit board includes expansion joints in the various layers to help provide relief to the electro-optical circuit board such that the waveguide cores can maintain proper operational tolerances.

An exemplary electro-optical circuit board may include a first substrate, a second substrate, and an optical layer positioned between the first substrate and the second substrate. The first substrate and second substrate may extend along a longitudinal direction. The optical layer may define a first optical layer surface and a second optical layer surface opposing the first optical layer surface. The optical layer may include a cladding layer, one or more polymeric waveguide cores and one or more optical layer recesses. The cladding layer may extend from the first optical layer surface to the second optical layer surface. The one or more polymeric waveguide cores may be at least partially within the cladding layer and extending along the longitudinal direction. The one or more optical layer recesses may extend into the cladding layer from the first optical layer surface or the second optical layer surface. The electro-optical circuit board may also include a compliant material having a Young's modulus of less than 1 GPa and disposed within the one or more optical layer recesses.

An exemplary system may include an electro-optical circuit board and a storage device coupled to the electro-optical circuit board. The electro-optical circuit board may include a substrate, a cladding layer, one or more polymeric waveguide cores, and an expansion joint. The substrate may define a first substrate surface and a second substrate surface opposing the first substrate surface. The cladding layer may be embedded within the substrate between the first substrate surface and the second substrate surface. The cladding layer may also define a first cladding layer surface and a second cladding layer surface opposing the first cladding layer surface. The one or more polymeric waveguide cores may be embedded within the cladding layer. The expansion joint may include a compliant material having a Young's modulus of less than 1 GPa and located in the cladding layer and extending into the first cladding layer surface or the second cladding layer surface. The substrate may define a coefficient of thermal expansion that is at least $10 \times 10^{-6}/°$ C. different than a coefficient of thermal expansion of the cladding layer.

An exemplary method of reducing thermal expansion stress may include providing an electro-optical circuit board. The electro-optical circuit board may include a first substrate, a second substrate, an optical layer, and a compliant material. The first and second substrate may extend along a longitudinal direction. The optical layer may be positioned between the first substrate and the second substrate and may define a first optical layer surface and a second optical layer surface opposing the first optical layer surface. The optical layer may include a cladding layer, one or more polymeric waveguide cores, and one or more optical layer recesses. The cladding layer may extend from the first optical layer surface to the second optical layer surface. The one or more polymeric waveguide cores may be at least partially disposed within the cladding layer and may extend along the longitudinal direction. The one or more optical layer recesses may extend into the cladding layer from the first optical layer surface or the second optical layer surface. The compliant material may have a Young's Modulus of less than 1 GPa and may be disposed within the one or more optical layer recesses. The method may also include heating the electro-optical circuit board to create thermal expansion stress within the optical layer. Further, the method may include dispersing the thermal expansion stress within the compliant material.

An exemplary method of optical data transmission may include transmitting light through a polymeric waveguide core of an electro-optical circuit board. The electro-optical circuit board may include a first substrate and a second substrate, each extending along a longitudinal direction. The electro-optical circuit board may also include an optical layer positioned between the first substrate and the second substrate and may define a first optical layer surface and a second optical layer surface opposing the first optical layer surface. The optical layer may include a cladding layer extending from the first optical layer surface to the second optical layer surface and one or more polymeric waveguide cores contained within the cladding layer, the one or more polymeric waveguide cores may extend along the longitudinal direction. The optical layer may also include one or more optical layer recesses extending into the cladding layer from the first optical layer surface or the second optical layer surface. The electro-optical circuit board may also include a compliant material having a Young's modulus of less than 1 GPa and disposed within the one or more optical layer recesses.

The above summary is not intended to describe each embodiment or every implementation of the present disclosure. A more complete understanding will become apparent and appreciated by referring to the following detailed description and claims taken in conjunction with the accompanying drawings. In other words, these and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings.

DETAILED DESCRIPTION

Figure 1:
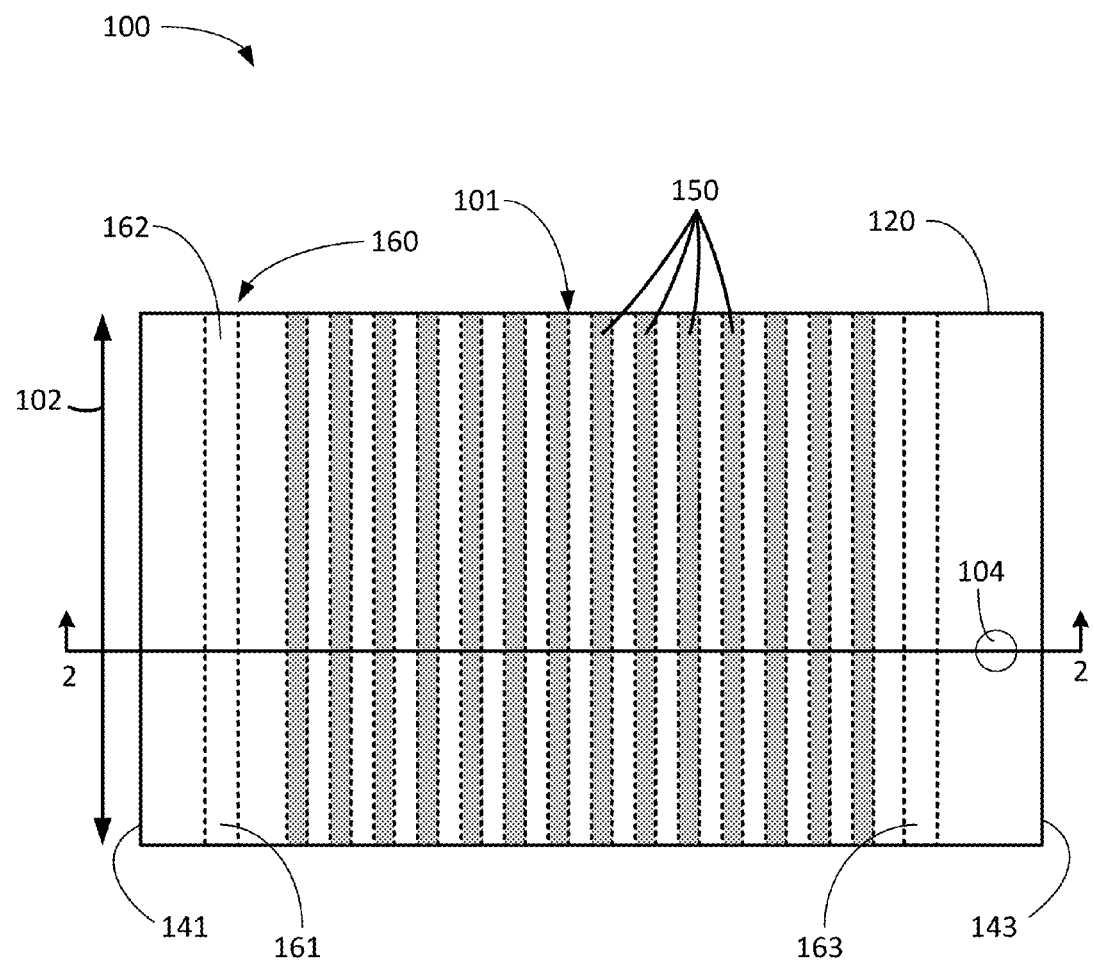
FIG. 1 is a top view of an exemplary electro-optical circuit board including one or more optical layer recesses.

The disclosure herein includes exemplary systems, apparatus, structures, and methods for providing stress relief to an optical waveguide in an assembly such as, e.g., a printed circuit board (PCB) assembly. Electronic devices such as, e.g., storage devices, computing devices, networking devices, etc. may use and/or include circuit boards (e.g., PCBs) including one or more optical waveguides.

Optical waveguides located within a PCB, also known as an electro-optical circuit board (this disclosure describes electro-optical circuit boards but may be applicable to any other type of PCB), may encounter a variety of stresses and strains during the manufacture and use of such electro-optical circuit boards. For example, the electro-optical circuit boards are exposed to many differing thermal conditions (e.g., rapid rising and lowering of circuit board temperature) throughout the course of the lifetime of the electro-optical circuit board (e.g., during manufacturing/fabrication, during normal operation, etc.). One specific example of a thermal condition placed upon electro-optical circuit boards is a thermal lamination process (e.g., for coupling multiple layers of the electro-optical circuit board together using heat and pressure) that may be described as an integral part of PCB fabrication.

These differing thermal conditions may produce temperature cycling, the effects of which may be magnified by potential mismatches of coefficient of thermal expansion (CTE) between the optical layer materials (e.g., waveguide cores and/or cladding) and the adjoining PCB materials (e.g., the substrates). As a result, the temperature cycling may lead to stresses and strains, or even cracking, of the optical layer (e.g., cladding and core layers) embedded within the PCB (e.g., the substrates). In other words, the system level temperature cycling during manufacturing and/or operation may cause variations in stress and strain on the optical layers within an electro-optical circuit board in the system.

Unpredictable stress profiles may have an adverse effect on the optical performance of the optical layer due to the typically large strain-optic coefficients of certain optical waveguide material, such as polymers, which may cause corresponding stress induced variations in refractive index across the optical layer. Because the refractive index profile of waveguides may govern optical loss and dispersion, such effects may be detrimental to more typical multimode waveguides (e.g., 50 μm by 50 μm cross-section) and may be particularly damaging to smaller single mode waveguides (e.g., 5 um by 5 um cross-section). The small size of the multimode waveguides and the single mode waveguides may be highly sensitive to stress induced refractive index perturbations, e.g., to the point where the waveguides may be non-functional if disrupted. The ability to work with smaller waveguides may lead to increasing bandwidth density by potentially over two orders of magnitude.

The exemplary methods, apparatus, structures, and systems described herein provide a relief structure that may reduce or mitigate stresses and strain profiles from generating in the optical layers during and after fabrication of the electro-optical circuit board. For example, a relief structure may be positioned in the electro-optical circuit board between the optical layer and the bounding PCB material layers (e.g., the substrates) to reduce (e.g., absorb) the stress and strain between the optical layer and the bounding PCB material layers (e.g., due to the electro-optical circuit board being exposed to various different temperatures). In one or more embodiments, the relief structure may expand and contract with other materials of the electro-optical circuit board (e.g., optical layer, substrate) to create an electro-optical circuit board that is more flexible and adaptive to temperature fluctuations. The relief structure may be positioned in a variety of different ways within the electro-optical circuit board, may be a variety of different shapes, and sizes and may include a variety of different materials.

Figure 2:
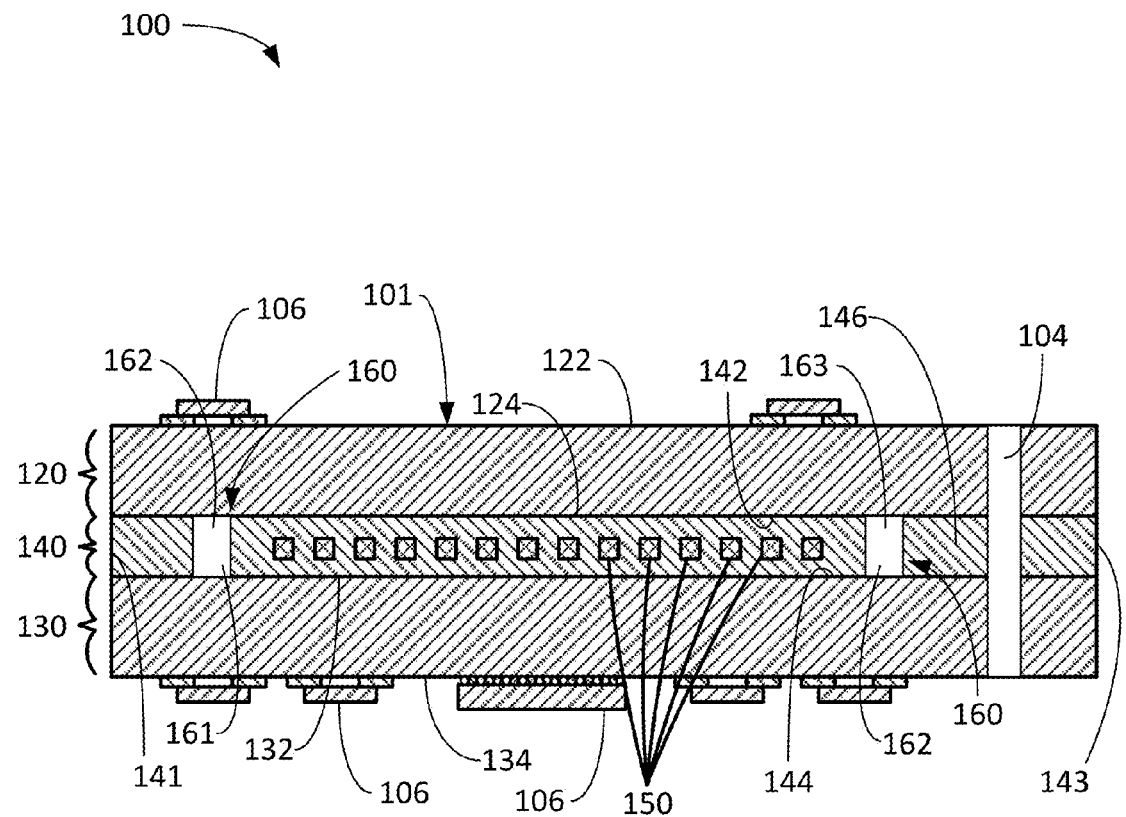
FIG. 2 is a cross-section view of the exemplary electro-optical circuit board of FIG. 1 including one or more optical layer recesses taken across line 2-2 of FIG. 1.

An exemplary assembly 100 including stress relief features (e.g., an expansion joint 160) is depicted in FIGS. 1-2. The exemplary assembly 100 may include a substrate 101 such as, e.g., an electro-optical printed circuit board or an optical printed circuit board without any electrical apparatus (e.g., electrical traces, integrated circuits, etc.). As shown in FIG. 2, the exemplary substrate 101 is an electro-optical circuit board and includes a plurality of integrated circuits 106 coupled thereto. FIG. 1 illustrates a top down view of a portion of the assembly 100. The assembly includes a plurality of waveguides 150 present within the substrate 101, which are depicted using dotted lines to indicate that the plurality of waveguides 150 are not visible from top view, but rather are located within the substrate 101. FIG. 2 illustrates a cross section of FIG. 1 taken across line 2-2.

The substrate 101 may include a first substrate 120 (e.g., first substrate layer), a second substrate 130 (e.g., a second substrate layer), and an optical layer 140 positioned between the first substrate 120 and the second substrate 130. The first substrate 120 may define a first, or upper, surface 122 and a second, or lower, surface 124 opposite the first surface 122 (e.g., the first surface 122 faces the opposite direction that the second surface 124 faces, the second surface 124 faces the opposite direction that the first surface 122 faces, etc.). Similarly, the second substrate 130 may define a first, or upper, surface 132 and a second, or lower, surface 134 opposite the first surface 132 (e.g., the first surface 132 faces the opposite direction that the second surface 134 faces, the second surface 134 faces the opposite direction that the first surface 132 faces, etc.).

The first and second substrates 120, 130 may be described as extending along a longitudinal direction 102. With respect to FIG. 1, the first substrate 120 and the second substrate (not shown) extend vertically beyond the boundaries of the horizontal lines framing the assembly 100. In one or more embodiments, the first and second substrates 120, 130 may extend such that a length of the first and second substrates 120, 130 along the longitudinal direction 102 is greater than a width (e.g., measured perpendicular to the longitudinal direction 102) of the first and second substrates 120, 130.

The first and second substrates 120, 130 may include a variety of different materials. In one or more embodiments, the first and second substrates 120, 130 may include, e.g., FR4, Rogers, fibre reinforced resin, glass, etc. More specifically, in one or more embodiments, the first and second substrates 120, 130 may include a polymer such as, e.g., polyimide, polyacrylate, polysiloxane, polynorbonene, polyurethane, etc.

In one or more embodiments, the optical layer 140 may be positioned between the first substrate 120 and the second substrate 130. For example, the optical layer 140 may be positioned between the second surface 124 of the first substrate 120 and the first surface 132 of the second substrate 130. As shown in FIG. 2, the optical layer 140 may define a first optical layer surface 142 and a second optical layer surface 144 opposite the first optical layer surface 142 (e.g., the first optical layer surface 142 faces the opposite direction that the second optical layer surface 144 faces, the second optical layer surface 144 faces the opposite direction that the first optical layer surface 142 faces, etc.). In one or more embodiments, the optical layer 140 may be the top or bottom surface. In other words, the first or second substrate 120, 130 may not be present on one side of the optical layer 140. In one or more embodiments, there may be multiple optical layers 140 stacked on one another between the first and second substrate 120, 130. The multiple stacked optical layers 140 may be separated by electrical layers (not shown).

The optical layer 140 may be positioned between the first substrate 120 and the second substrate 130 such that the first optical layer surface 142 is adjacent (e.g., next to, in contact with, etc.) the second surface 124 of the first substrate 120 and the second optical layer surface 144 is adjacent (e.g., next to, in contact with, etc.) the first surface 132 of the second substrate 130. In one or more embodiments, the assembly 100 may include a plurality of layers including one or more different materials to facilitate the electrical and optical functionality of the assembly 100 or for any other suitable purpose. For example, the assembly may include a layer between the first substrate 120 and the optical layer 140 and/or the second substrate 130 and the optical layer 140.

The optical layer 140 may include a cladding layer 146 extending from the first optical layer surface 142 to the second optical layer surface 144. In one or more embodiments, the cladding layer 146 may be described as embedded within (e.g., contained within) the substrate (e.g., the first substrate 120 and the second substrate 130 combined) between the first substrate surface (e.g., the first surface 122 of the first substrate 120) and the second substrate surface (e.g., the second surface 134 of the second substrate 130). The cladding layer 146 may define a first cladding layer surface (e.g., the first optical layer surface 142) and a second cladding layer surface (e.g., the second optical layer surface 144) opposing the first cladding layer surface.

The optical layer 140 may also include one or more polymeric waveguide cores 150 contained within the cladding layer 146 and extending along the longitudinal direction 102. In one or more embodiments, the one or more polymeric waveguide cores 150 may be described as embedded within (e.g., contained within) the cladding layer 146. The one or more polymeric waveguide cores 150 are configured to transmit a signal (e.g., an optical signal, light, etc.) through the assembly 100 (e.g., an electro-optical circuit board).

The cladding layer 146 and the one or more polymeric waveguide cores 150 may include a variety of materials such that an optical signal may transmit through the one or more polymeric waveguide cores 150. For example, the refractive index of the cladding layer 146 may be about e.g., greater than or equal to 1.45, greater than or equal to 1.47, greater than or equal to 1.48, greater than or equal to 1.50, etc., and/or less than or equal to 1.54, less than or equal to 1.53, less than or equal to 1.51, less than or equal to 1.49, etc., and the refractive index of the one or more polymeric waveguide cores 150 may be about e.g., greater than or equal to 1.55, greater than or equal to 1.56, greater than or equal to 1.57, greater than or equal to 1.59, etc., and/or less than or equal to 1.65, less than or equal to 1.62, less than or equal to 1.60, less than or equal to 1.58, etc. Specifically, the cladding layer 146 may include, e.g., polynorbonene (with, e.g., a refractive index of about 1.52), polyacrylate (with, e.g., a refractive index of about 1.53), polysiloxane (with, e.g., a refractive index of about 1.52), etc. and the one or more waveguide cores 150 may include, e.g., polynorbonene (with, e.g., a refractive index of about 1.54), polyacrylate (with, e.g., a refractive index of about 1.56), polysiloxane (with, e.g., a refractive index of about 1.54), etc. Any suitable material may have a variety of different refractive index values depending on the formulation of the material. For example, polysiloxane may be used as the core and cladding, just with slightly different formulations, such as choice of, blend of, and concentration of photoinitiators, to provide differing refractive indices. The refractive index may be measured using, e.g., Active Standard ASTM E1967, ASTM E1967-11a, Active Standard ASTM D542, ASTM D542-14, Active Standard ASTM D1218, ASTM D1218-12, etc.

The one or more polymeric waveguide cores 150 may include any number of polymeric waveguide cores 150 suitable to carry a signal through the assembly 100. For example, the one or more polymeric waveguide cores 150 may include at least three waveguide cores, at least five waveguide cores, at least seven waveguide cores, at least ten waveguide cores. As shown in FIGS. 1-2, the one or more polymeric waveguide cores 150 include fourteen waveguide cores arranged along a plane. In one or more embodiments, the one or more polymeric waveguide cores 150 may be arranged in multiple planes such that the planes are layered and form a matrix (e.g., two polymeric waveguide cores by five polymeric waveguide cores, two polymeric waveguide cores by ten polymeric waveguide cores).

The one or more polymeric waveguide cores 150 may support a variety of optical modes. For example, the one or more polymeric waveguide cores 150 may form a single mode waveguide or a multimode waveguide. A multimode waveguide may be described by a, e.g., 50 μm by 50 μm cross-section, and a single mode waveguide may be described by a, e.g., 5 μm by 5 μm cross-section. The small size of the multimode waveguides and the single mode waveguides may be highly sensitive to stress induced refractive index perturbations, e.g., to the point where the waveguides may be non-functional if disrupted.

In one or more embodiments, the one or more polymeric waveguide cores 150 may be arranged in a variety of different ways. For example, the one or more polymeric waveguide cores 150 may be arranged such that the one or more polymeric waveguide cores 150 are parallel and coextensive for at least a distance along the longitudinal direction 102. In one or more embodiments, at least one of the one or more polymeric waveguide cores 150 may deviate from a path that is coextensive or parallel with another of the one or more polymeric waveguide cores 150 (e.g., to branch off for any suitable purpose). The optical layer 140 may define a first optical layer side 141 and a second optical layer side 143 (e.g., at the boundary of the assembly 100), both extending along the longitudinal direction 102. The one or more polymeric waveguide cores 150 may be positioned between the first optical layer side 141 and the second optical layer side 143.

In one or more embodiments, interactions may occur between the first substrate 120 or the second substrate 130 and the optical layer 140 (e.g., the cladding layer 146) due to the difference in material compositions between the layers. For example, the first substrate 120 or the second substrate 130 may act differently than the optical layer 140 through the course of operation and manufacture/fabrication of the assembly 100, and as a result, stresses and strains may be placed at the intersections between the first and second substrates 120, 130 and the optical layer 140. One example for which the first or second substrates 120, 130 and optical layer 140 may behave differently is with regards to temperature.

The coefficient of thermal expansion for each of the first and second substrates 120, 130 may be different than the coefficient of thermal expansion for the optical layer 140 (e.g., cladding layer 146). For example, the coefficient of thermal expansion for the optical layer 140 may be about greater than or equal to 800%, greater than or equal to 1000%, or greater than or equal to 1200% of the substrate coefficient of thermal expansion for each of the first and second substrates 120, 130. It may also be described that the substrate coefficient of thermal expansion may be at least $25\times10^{-6}/^\circ$ C., $17\times10^{-6}/^\circ$ C. (e.g., for FR4), or $10\times10^{-6}/^\circ$ C. (e.g., for Rogers RO4000® Series) different than the coefficient of thermal expansion of the optical layer 140. Specifically, the substrate coefficient of thermal expansion for each of the first and second substrates 120, 130 may be about greater than or equal to $10\times10^{-6}/^\circ$ C., greater than or equal to $15\times10^{-6}/^\circ$ C., greater than or equal to $25\times10^{-6}/^\circ$ C., etc. and/or less than or equal to $50\times10^{-6}/^\circ$ C., less than or equal to $30\times10^{-6}/^\circ$ C., less than or equal to $20\times10^{-6}/^\circ$ C., etc. The coefficient of thermal expansion for the optical layer 140 (e.g., the cladding layer 146) may be greater than or equal to $100\times10^{-6}/^\circ$ C., greater than or equal to $250\times10^{-6}/^\circ$ C., greater than or equal to $400\times10^{-6}/^\circ$ C., etc. and/or less than or equal to $600\times10^{-6}/^\circ$ C., less than or equal to $500\times10^{-6}/^\circ$ C., less than or equal to $300\times10^{-6}/^\circ$ C., etc. The coefficients of thermal expansion may be measured using, e.g., Active Standard ASTM E831, ASTM E831-14, Active Standard ASTM D696, ASTM D696-08e1, etc.

The difference in coefficient of thermal expansion between the first or second substrates 120, 130 and the optical layer 140 may cause damage between the layers when the assembly heats up and cools down. This is because the first or second substrates 120, 130 and the optical layer 140 expand and contract at different rates, and therefore, stresses and strains are placed on the intersection where the first or second substrate 120, 130 is coupled (e.g., laminated, bonded, etc.) to the optical layer 140. In other words, the first or second substrate 120, 130 and/or optical layer 140 may break or crack to accommodate the differing expanding and contracting at the surface of the layers. As a result, the one or more polymeric waveguide cores 150 may be affected by a shift in the cladding layer 146 of the optical layer 140.

The assembly 100 may experience differing temperature cycles for a variety of reasons. A temperature change may be the result of the manufacturing/fabrication process or may be the result of normal operation of the electro-optical circuit board. These temperature changes may cause unpredictable changes in the first and second substrates 120, 130 or the optical layer 140 such that electro-optical circuit board is no longer able to function properly. Optical polymers may have a large strain-optic coefficient that determines the size of change in refractive index with change in stresses and strains applied to the polymer. Since the refractive index may be important to the performance of the waveguide, in particular the refractive index difference between the waveguide core and the waveguide cladding, changes in stress and strain across the optical layer 140 may cause unpredictable variations in refractive index, which are localized to the spread of the stress/strain in the material. For example, this could lead to an increase in refractive index difference between core and cladding in certain parts of the waveguide and a decrease in refractive index between core and cladding in other parts of the same waveguide. The resulting changes in optical confinement may cause increased loss. In addition, due to the fact that CTE (coefficient of thermal expansion) can be anisotropic, e.g., having a different value of thermal expansion in the plane of the layer compared to in the direction orthogonal to the plane of the layer, this may lead to undesired or unpredictable birefringence in the one or more polymeric waveguide cores 150.

The assembly 100 may include a variety of features that may affect the temperature of the assembly 100 throughout the life and manufacturing of the assembly 100. For example, one example of sources of changing temperature of the assembly 100 may include the hot lamination process through which the first and second substrate 120, 130 may be coupled to the optical layer 140. Hot lamination is a process that heats up the surfaces of the first and second substrates 120, 130 and the optical layer 140 such that each may be coupled to one another at the surfaces (e.g., the first substrate 120 to the optical layer 140 and the second substrate 130 to the optical layer 140). Other examples of sources of changing temperature of the assembly 100 may include assembly (e.g., through) of the plurality of integrated circuits 106, passive electrical components (e.g., capacitors, resistors, inductors) or electro-mechanical components to the first or second substrate 120, 130 and drilling and plating vias 104 through the first and second substrate 120, 130 of the assembly 100. Another example of sources of changing temperature of the assembly 100 may include normal operation of the electro-optical circuit board and any fluctuations of temperature. Fluctuations in temperature may be uniform across the whole electro-optical circuit board due to changes in ambient temperature and/or localized to certain regions of the board, so called "hot-spots", hosting very power consumptive components such as Central Processing Units, switches or other high power integrated circuits. Finally, the assembly 100 may change temperatures for any other suitable reason as determined by one of skill in the art. Each of these sources of temperature change may contribute to the expansion and contraction of layers of the assembly (e.g., first substrate 120, second substrate 130, optical layer 140, etc.), which may result in added stress and strain on the assembly 100, and thus, undesirable stress and strain on the one or more polymeric waveguide cores 150, which in turn, may result in undesirable changes in refractive index of the optical core and cladding layers, which may affect the performance of the optical waveguides.

The assembly 100 includes one or more expansion joints 160 to provide relief to the assembly 100 such that the added stress and strain to the assembly 100 does not interfere the function of the assembly 100 (e.g., transmitting optical signals). The one or more expansion joints 160 may help to allow the first and second substrate 120, 130 and/or the optical layer 140 to expand and contract freely without damaging the assembly 100 (e.g., the one or more polymeric waveguide cores 150). In other words, the one or more expansion joints 160 may alleviate the stress and strain created in the first and second substrates 120, 130 or optical layer 140 (e.g., from changes in temperature to the assembly 100). In one or more embodiments, the one or more expansion joints 160 may include a vent (e.g., a connection to the exterior of the assembly 100) to prevent air from becoming trapped in the one or more expansion joints 160 and possibly causing damage.

The one or more expansion joints 160 may include one or more optical layer recesses 162 extending into the optical layer 140 (e.g., the cladding layer 146) from the first optical layer surface 142 or the second optical layer surface 144. The one or more optical layer recesses 162 may be described as a channel or groove like structure in the optical layer 140. The one or more optical layer recesses 162 may be positioned relative to the optical layer 140 in a variety of different ways (e.g., see FIGS. 2-7). As shown in FIG. 2, the one or more optical layer recesses 162 extend through the optical layer 140 from the first substrate 120 to the second substrate 130 (e.g., from the first optical layer surface 142 to the second optical layer surface 144). The one or more optical recesses 162 may also be positioned along the longitudinal direction 102 of the substrate 101 in a variety of different ways (e.g., see FIGS. 1 and 8-10). As shown in FIG. 1, the one or more optical layer recesses 162 extend along the longitudinal direction 102 and are parallel with (e.g., coextensive with) the one or more polymeric waveguide cores 150 for at least a portion of the longitudinal direction 102.

Furthermore, the one or more optical layer recesses 162 may be positioned relative to the one or more polymeric waveguide cores 150 in a variety of different ways. For example, the one or more optical layer recesses 162 may be positioned between polymeric waveguide cores of the one or more polymeric waveguide cores 150 or between the one or more polymeric waveguide cores 150 and the first or second optical layer side 141, 143. The one or more optical layer recesses 162 may be positioned close enough to the one or more polymeric waveguide cores 150 such that the expansion joint 160 (e.g., the one or more optical layer recesses 162) may provide relief to any stress or strain placed on the one or more polymeric waveguide cores 150. However, the one or more optical layer recesses 162 may not be within the field of the one or more polymeric waveguide cores 150 to avoid interference with the one or more polymeric waveguide cores 150. Specifically, the one or more optical layer recesses 162 may be positioned a distance away from the one or more polymeric waveguide cores 150 equal to the pitch between any two of the one or more individual polymeric waveguide cores 150. For example, the one or more optical layer recesses 162 may be positioned a distance away from the one or more polymeric waveguide cores 150 that is, e.g., greater than or equal to 100 micrometers, greater than or equal to 125 micrometers, greater than or equal to 250 micrometers, etc. and/or less than or equal to 500 micrometers, less than or equal to 375 micrometers, less than or equal to 200 micrometers, etc.

The one or more optical layer recesses 162 may define a variety of shapes and sizes. For example, the one or more optical layer recesses 162 may define a cross-section shape that is square, rectangular, trapezoidal, triangular, etc. Similarly, the one or more optical layer recesses 162 may define a variety of shapes as viewed from above the assembly 101 (e.g., as shown in FIG. 1). For example, the one or more optical layer recesses 162 may define a shape (e.g., as viewed in FIG. 1) that extends along the substrate in a continuous (e.g., "ribbon like," rectangles, undulating, etc.) or discontinuous manner (e.g., "islands," elements, squares, triangles, rectangles, etc.). Also, the cross-sectional width (e.g., measured perpendicular to the longitudinal direction 102) of the one or more optical layer recesses 162 may by, e.g., greater than or equal to 125 micrometers, greater than or equal to 250 micrometers, greater than or equal to 500 micrometers, greater than or equal to 1 millimeter, etc. and/or less than or equal to 10 millimeters, less than or equal to 5 millimeters, less than or equal to 3 millimeters, less than or equal to 2 millimeters, less than or equal to 1.5 millimeters, etc. The cross-sectional width of the one or more optical layer recesses 162 may be measured at a variety of different points. For example, the cross-sectional width of the one or more optical layer recesses 162 may be measured at the first optical layer surface 142, at the second optical layer surface 144, at a maximum or minimum cross-sectional width between the first optical layer surface 142 and the second optical layer surface 144.

In one or more embodiments, the one or more optical layer recesses 162 may include any number of recesses within the optical layer 140. For example, the one or more optical layer recesses 162 may include two optical layer recesses, three optical layer recesses, four optical layer recesses, five optical layer recesses, a plurality of optical layer recesses, etc. For example, the various recesses may include a plurality of discontinuous recesses or a plurality of recesses that extend for a length along the longitudinal direction 102. As shown in FIGS. 1-2, the one or more optical layer recesses 162 includes a first optical layer recess 161 and a second optical layer recess 163. Furthermore, the first optical layer recess 161 is positioned between the first optical layer side 141 and the one or more polymeric waveguide cores 150 and the second optical layer recess 163 is positioned between the second optical layer side 143 and the one or more polymeric waveguide cores 150. In other words the one or more polymeric waveguide cores 150 separate the first optical layer recess 161 from the second optical layer recess 163. However, the first and second optical layer recesses 161, 163 may be positioned in any suitable way to assist as relief structures for the assembly 100.

Figure 3:
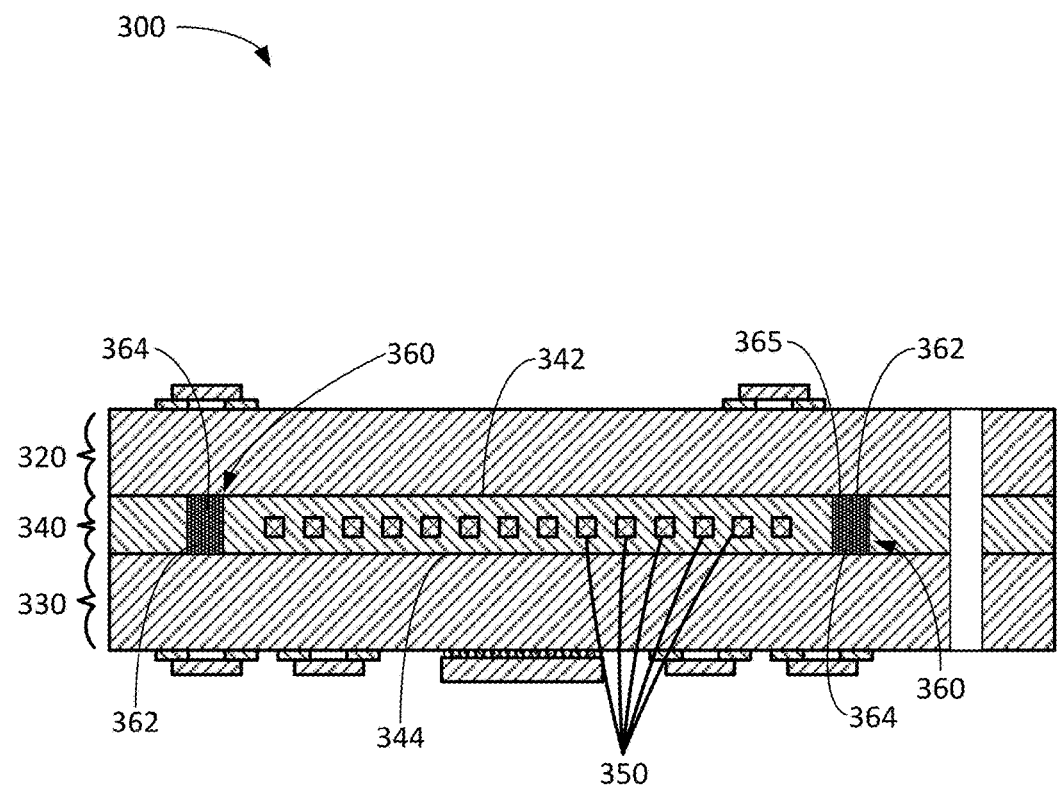
FIG. 3 is a cross-section view of an exemplary electro-optical circuit board including a compliant material disposed in one or more optical layer recesses.

The assembly 300 (e.g., the expansion joint 360) may also include a compliant material 364 located (e.g., disposed) within the one or more optical layer recesses 362 of the expansion joint 360 as shown in FIG. 3. The compliant material 364 may provide relief from the stress and strain placed on the assembly 300 due to the mismatch in coefficient of thermal expansions of the first and second substrate 320, 330 and the optical layer 340. In other words, the compliant material 364 may help to alleviate the differing expansions and contractions of the first and second substrates 320, 330 and the optical layer 340 due to a change in temperature to the assembly 300. In one or more embodiments, the one or more optical layer recesses 362 and the compliant material 364 form the expansion joint 360 that may allow for deflection in the axial (compressive), lateral (shear), or angular (bending) directions. As a result of the expansion joint 360, the assembly 300 maintains its shape, specifically the one or more polymeric waveguide cores 350, such that the electro-optical circuit board may function properly (e.g., to transmit an optical signal through the optical layer 140).

The compliant material 364 may include various material components and be defined by various physical properties to provide a relief structure to the assembly 300. For example, the compliant material 364 may include any conformable material that is flexible and yielding within the one or more optical layer recesses 362 (e.g., the compliant material 364 may be more yielding/compliant than at least one of the materials/elements in contact with the compliant material 364). Specifically, the compliant material 364 may include a material such as polytetrafluoroethylene, Teflon, elastomer, rubber, foam, etc. The compliant material 364 may also be defined by a physical property such as, e.g., Young's Modulus. Young's Modulus is a determination of the amount a body deforms when a load is applied. For example, the Young's Modulus of a material describes the amount by which a material may deform when a load is applied to the material. In other words, the Young's Modulus of a material may describe the stiffness of a material or the amount of "give" in the material. In one or more embodiments, the Young's Modulus of the compliant material 364 may be lower than the Young's Modulus of the first and second substrate 320, 330 and the optical layer 340 to allow the assembly 300 to be more conformable to stress and strain placed on the assembly 300 through the compliant material 364. In other words, the lower Young's Modulus of the compliant material 364 (e.g., as compared to the optical layer 340 and the first/second substrate 320, 330) provides more flexibility in the assembly 300 to move due to expansions and contraction from changes in temperatures present in the assembly 300. The Young's Modulus of the compliant material may be, e.g., less than or equal to 3 GPa, less than or equal to 2 GPa, less than or equal to 1 GPa, less than or equal to 0.5 GPa, less than or equal to 0.25 GPa, etc. In comparison, the first and second substrates 320, 330 can have a Young's Modulus of about, e.g., 2.5 GPa, in many embodiments. The Young's Modulus may be measured using, e.g., Active Standard ASTM E111, ASTM E111-04 (2010), etc.

The compliant material 364 may be positioned within the one or more optical layer recesses 362 in a variety of different ways. For example, the compliant material 364 may fill up the entirety of the one or more optical layer recesses 362 or only a partial amount of the one or more optical layer recesses 362. As shown in FIG. 3, the compliant material 364 is disposed in both recesses of the one or more optical layer recesses 362 such that a compliant surface 365 of the compliant material is in a plane with the first optical layer surface 342 and/or the second optical layer surface 344. In one or more embodiments, the compliant material 364 may not be disposed in every recess of the one or more optical layer recesses 362. In other words, the compliant material 364 may be disposed in select recesses of the one or more optical layer recesses 362 but not others.

Figure 4:
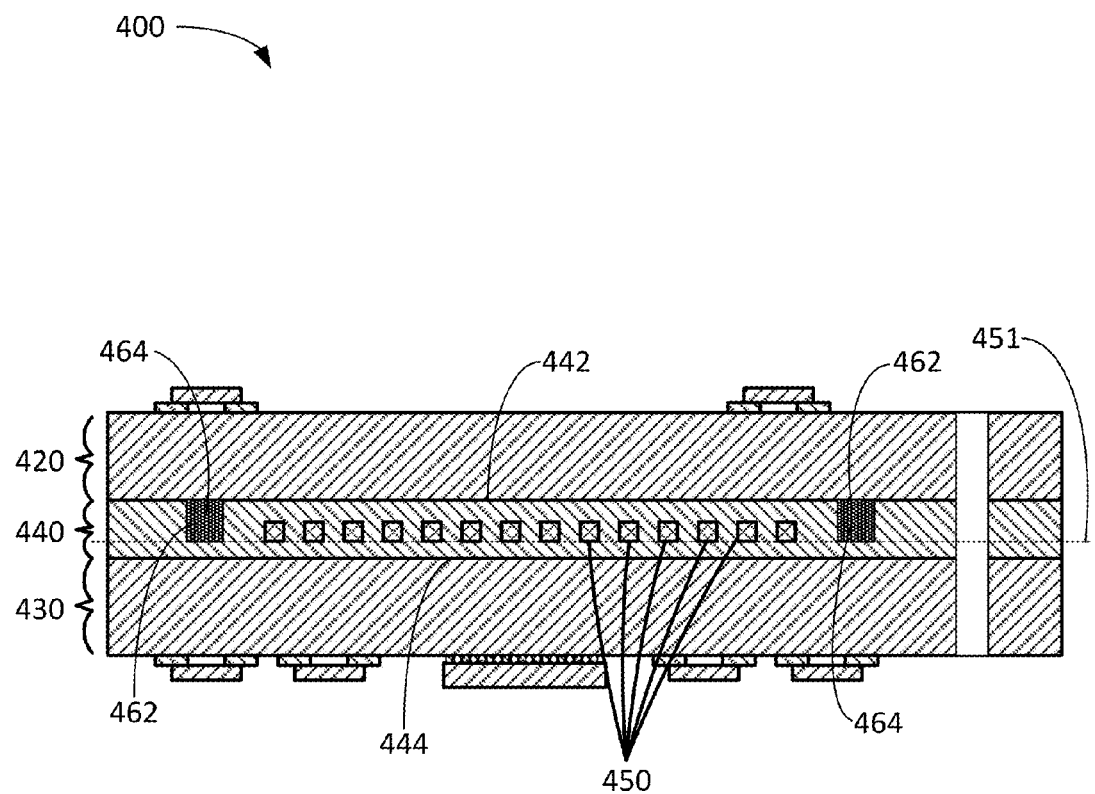
FIG. 4 is a cross-section view of another exemplary electro-optical circuit board including a compliant material disposed in one or more optical layer recesses.

FIG. 4 illustrates an assembly 400 including the one or more optical layer recesses 462 extending only a portion into the optical layer 440. The one or more optical layer recesses 462 may extend any distance into the optical layer 440 and from the first optical layer surface 442 adjacent the first substrate 420 and/or the second optical layer surface 444 adjacent the second substrate 430. As shown in FIG. 4, the one or more optical layer recesses 462 (and, e.g., the compliant material 464 disposed therein) extends from the first optical layer surface 442 to about a line 451 that is defined along the bases of the one or more polymeric waveguide cores 450. The optical layer recesses 462 may extend to this line 451 due to the method of fabricating the one or more polymeric waveguide cores 450. (e.g., an upper cladding may be deposited upon the one or more polymeric waveguide cores 450 and cured, then etched to form the one or more optical layer recesses 462 down to the line 451 along the base of the one or more polymeric waveguide cores 451). In one or more embodiments, the one or more optical layer recesses 462 may extend to a center waveguide point that is defined through the centers of the one or more polymeric waveguide cores 450. The center waveguide point may be equidistant from the first optical layer surface 442 and the second optical layer surface 444. In one or more embodiments, the one or more optical layer recesses 462 (and, e.g., the compliant material 464 disposed therein) may extend to at least the center waveguide point (e.g., to the top of one or more polymeric waveguide cores 450). In other embodiments, the one or more optical layer recesses 462 may not extend beyond the center waveguide point.

Figure 5:
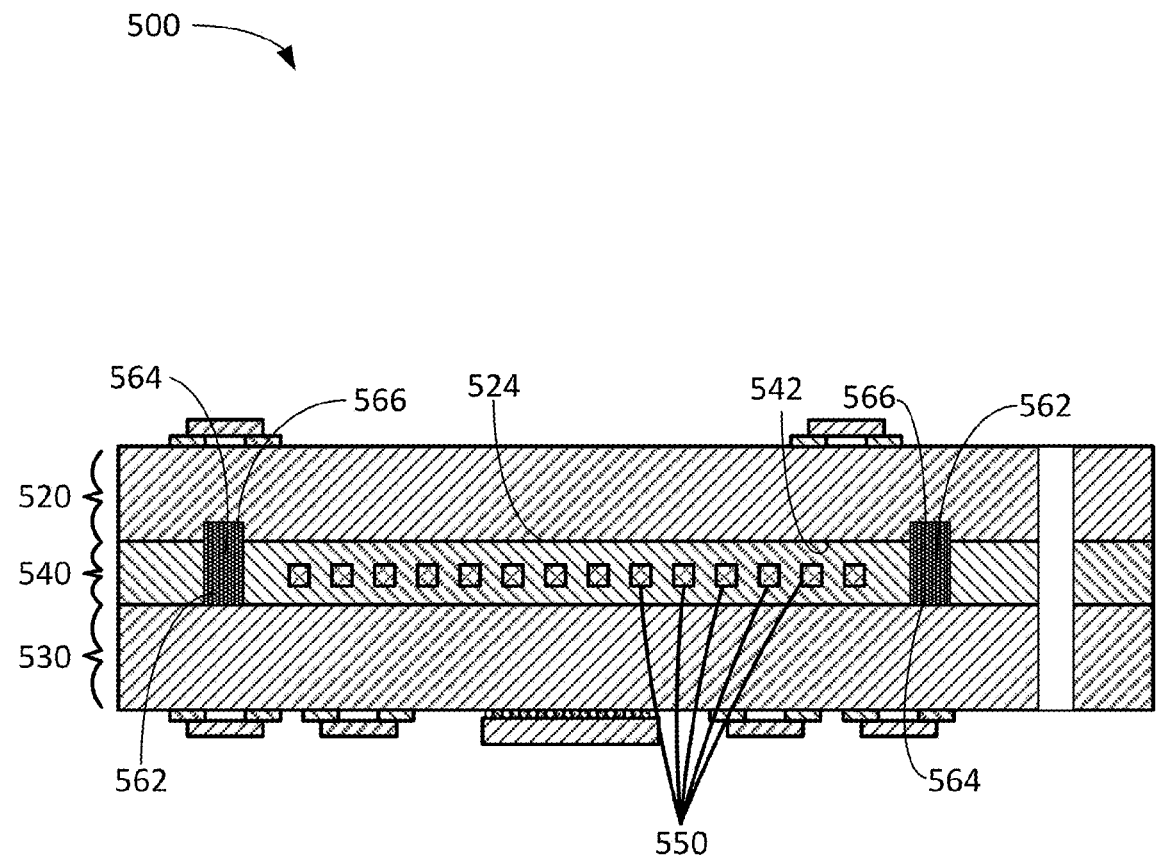
FIG. 5 is a cross-section view of an exemplary electro-optical circuit board including a compliant material disposed in one or more optical layer recesses and one or more substrate recesses.
Figure 7:
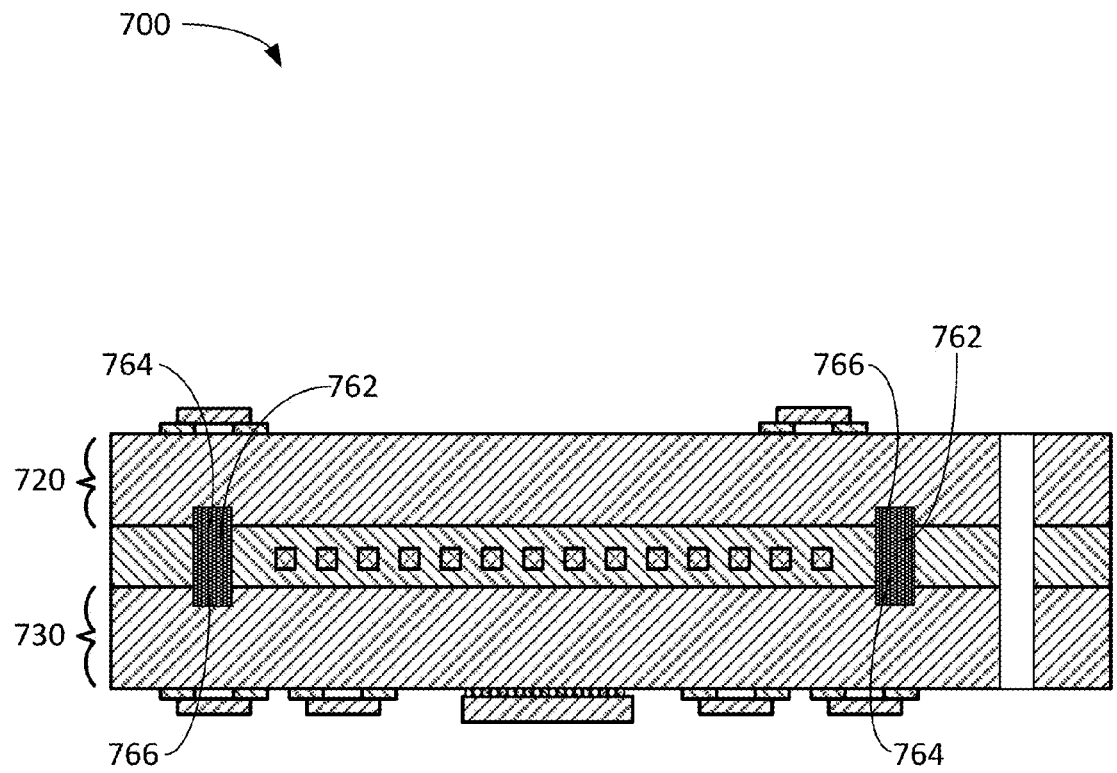
FIG. 7 is a cross-section view of yet another exemplary electro-optical circuit board including a compliant material disposed in one or more optical layer recesses and one or more substrate recesses.

FIG. 5 illustrates an assembly 500 including a first substrate 520 defining one or more substrate recesses 566 extending into the first substrate 520 (e.g., through the second substrate surface 524 of the second substrate 520). The one or more substrate recesses 566 may also include compliant material 564 disposed therein. Similarly (e.g., as shown in FIG. 7), the second substrate 530 may also define one or more substrate recesses 566. The one or more substrate recesses 566 may extend into at least one of the first substrate 520 and the second substrate 530. The one or more substrate recesses 566 may include any of the same characteristics of the one or more optical layer recesses as described herein.

The presence of the one or more substrate recesses 566 and compliant material 564 disposed therein may help to further provide relief to the assembly 500 from any stress or strain, e.g., caused by differing temperatures. The one or more substrate recesses 566 (e.g., with compliant material 564 disposed therein) may provide more flexibility in the first and second substrates 520, 530, similar to the one or more optical layer recesses 562 as described herein. Additionally, the one or more substrate recesses 566 and the one or more optical layer recesses 562 may align to, e.g., interlock, such that the compliant material 564 extends between the first and/or second substrates 520, 530 and the optical layer 540. This interlocking of the compliant material 564 may provide additional relief by overlapping the portions of each of the first and second substrates 520, 530 and the optical layer 540 that are more flexible due to the compliant material 564 disposed therein. In other words, the increased stress relief may be distributed between the first and second substrates 520, 530 and the optical layer 540 as a result.

Figure 6A:
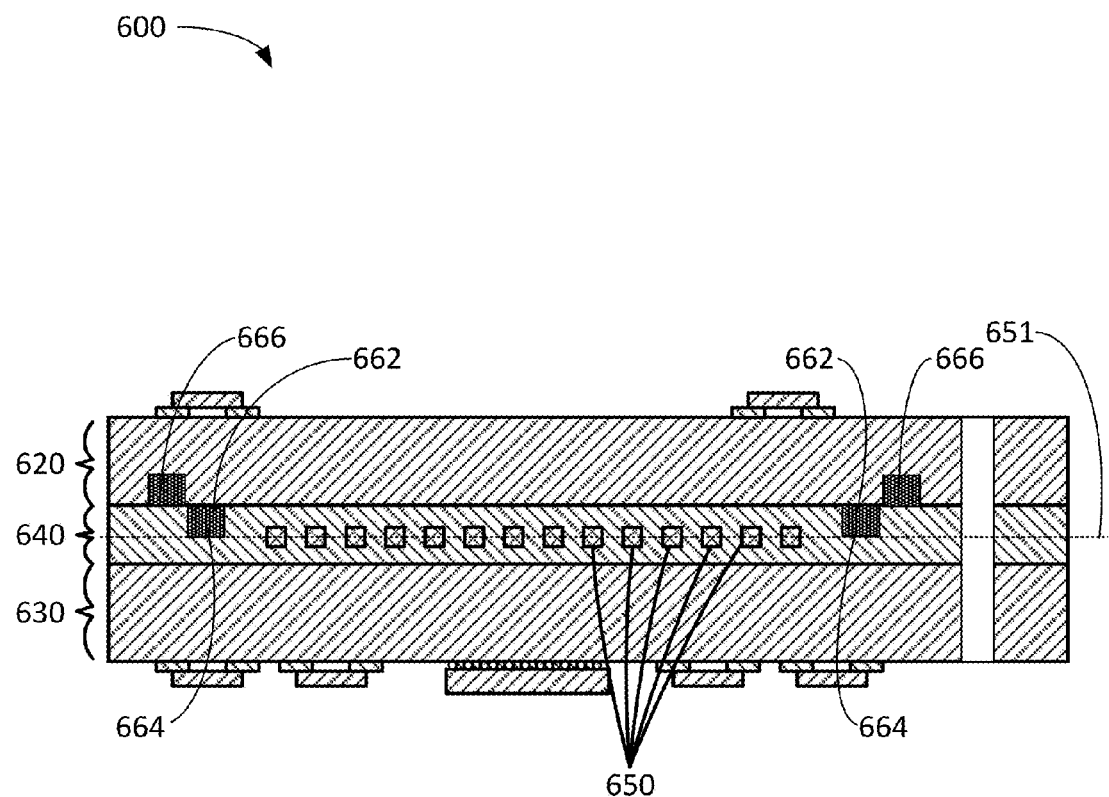
FIG. 6A is a cross-section view of another exemplary electro-optical circuit board including a compliant material disposed in one or more optical layer recesses and one or more substrate recesses.

An assembly 600 including one or more optical layer recesses 662 that are offset from one or more substrate recesses 666 is depicted in FIG. 6A. In other words, the one or more optical layer recesses 662 may be positioned in the optical layer 640 adjacent to, but not overlapping, the one or more substrate recesses 666 positioned in the first substrate 620. In one or more embodiments, the one or more optical layer recesses 662 and the one or more substrate recesses 666 may overlap (or interlock) for at least a portion of the recesses in the lateral direction (e.g., the horizontal axis 651 as shown in FIG. 6A).

Figure 6B:
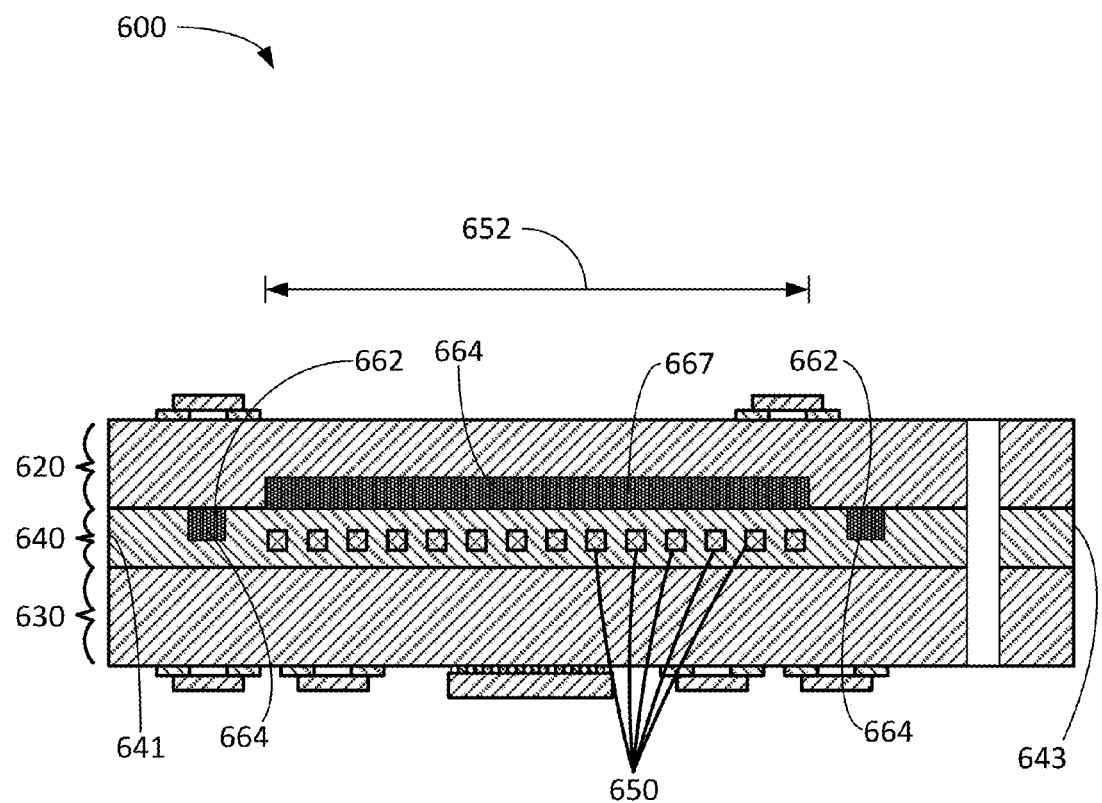
FIG. 6B is a cross-section view of another exemplary electro-optical circuit board including a compliant material disposed in one or more optical layer recesses and one or more substrate recesses.

In one or more embodiments, the compliant material 664 may or may not be disposed in the one or more substrate recesses 666 and the one or more optical layer recesses 662 as described herein. In one or more embodiments, there may be a gap in the lateral direction (e.g., the horizontal direction as shown in FIG. 6A) between the one or more optical layer recesses 662 and the one or more substrate recesses 666. As shown in FIG. 6A, the one or more optical layer recesses 662 are closer to the one or more polymeric waveguide cores 650 than the one or more substrate recesses 666 to, e.g., provide stress relief in the optical layer 640 closer to the one or more polymeric waveguide cores 650. However, in one or more embodiments, the one or more substrate recesses 666 may be closer to the one or more polymeric waveguide cores 650 than the one or more optical layer recesses 664 (e.g., as shown in FIG. 6B). Additionally, the one or more substrate recesses 666 may be positioned in the second substrate 630 in addition to, or instead of the one or more substrate recesses 666 located in the first substrate 620. As such, the one or more optical layer recesses 662 may be similarly offset or overlapping with the one or more substrate recesses positioned in the second substrate 630 (not shown).

FIG. 6B illustrates one or more substrate recesses 667 (e.g., with compliant material 664 disposed therein) extending along the first substrate 620 and adjacent the one or more polymeric waveguide cores 650 (e.g., between the one or more optical layer recesses 662, for at least a portion of the width of the one or more polymeric waveguide cores 650). For example, as shown in FIG. 6B, the one or more polymeric waveguide cores 650 extend a waveguide group width 652 between a first optical layer side 641 and a second optical layer side 643 and the one or more substrate recesses 667 may extend along the first substrate 620 for at least a portion of the waveguide group width 652. In one or more embodiments, the one or more substrate recesses 667 may extend along the first substrate 620 for the entirety of the waveguide group width 652 or a distance greater than the waveguide group width 652. This positioning of the one or more substrate recesses 667 may provide an increased amount of stress relief for each of the one or more polymeric waveguide cores 650. Similarly, the one or more substrate recesses 667 may be positioned in the second substrate 630 in addition to, or instead of the one or more substrate recesses 667 located in the first substrate 620.

An assembly 700 including one or more substrate recesses 766 located in both the first and second substrates 720, 730 as well as one or more optical layer recesses 762 is depicted in FIG. 7. The one or more substrate recesses 766 and the one or more optical layer recesses 762 may be aligned and include a compliant material 764 disposed therein similar to as described with respect to FIG. 5.

Figure 8:
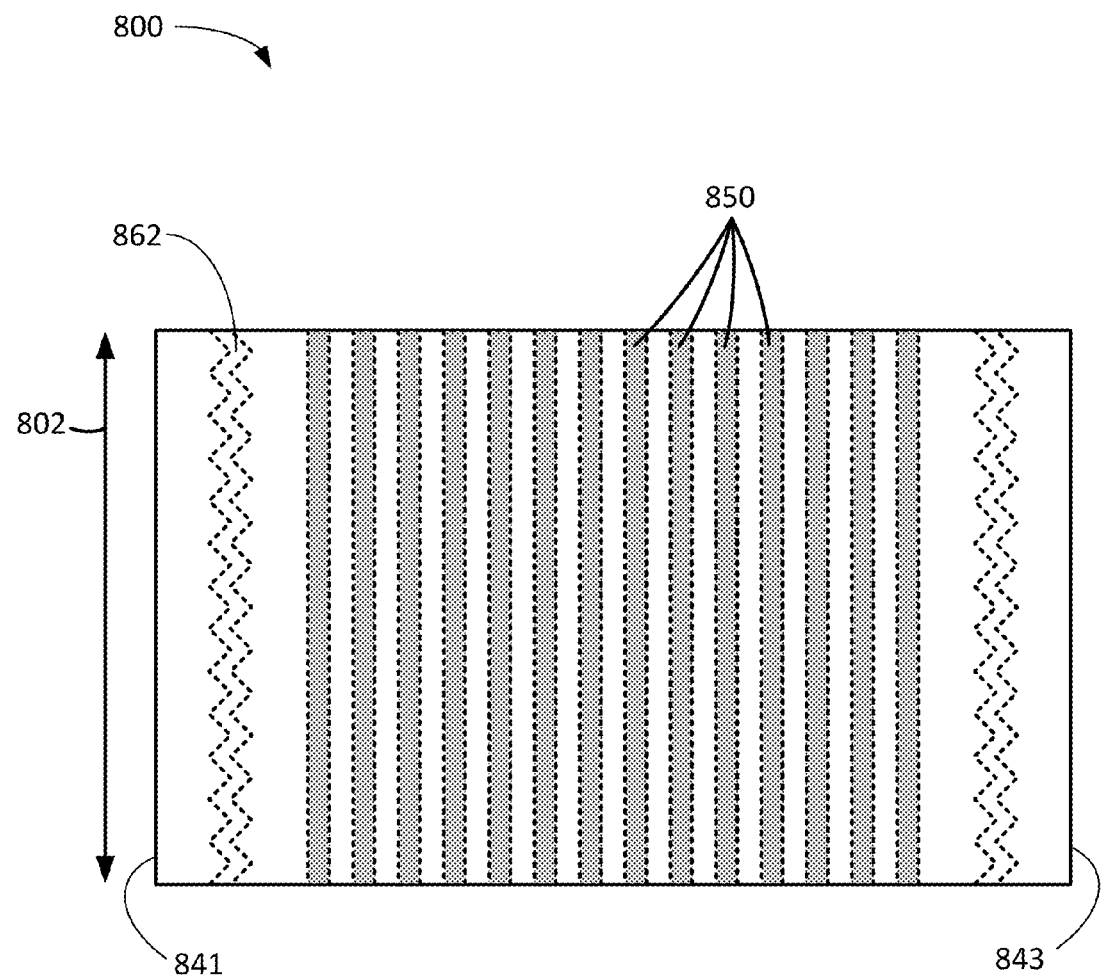
FIG. 8 is a top view of another exemplary electro-optical circuit board including one or more optical layer recesses defining a zig-zag pattern.

FIG. 8 illustrates a top view of the assembly 800 with the one or more optical layer recesses 862 and the one or more polymeric waveguide cores 850 outlined with dotted lines (e.g., because a substrate would block the one or more optical layer recesses 862 and the one or more polymeric waveguide cores 850 from the top view). As shown in FIG. 8, the one or more optical layer recesses 862 extend along the longitudinal direction 802 between the first optical layer side 841 and the one or more polymeric waveguide cores 850, as well as between the second optical layer side 843 and the one or more polymeric waveguide cores 850. The one or more optical layer recesses 862 may define a variety of different shapes extending along the longitudinal direction 802. For example, the one or more optical layer recesses 862 may define an undulating shape. Specifically, the one or more optical layer recesses 862 may define, e.g., a zig-zag shape or back and forth shape. This undulating shape of the one or more optical layer recesses 862 may reduce the gap width of the one or more optical layer recesses 862. In other words, the width of the one or more optical layer recesses 862 may be reduced because the effective width of the zig-zag shape (e.g., width from peak to peak of the zig-zag) controls the amount of relief the one or more optical layer recesses 862 provides.

Figure 9:
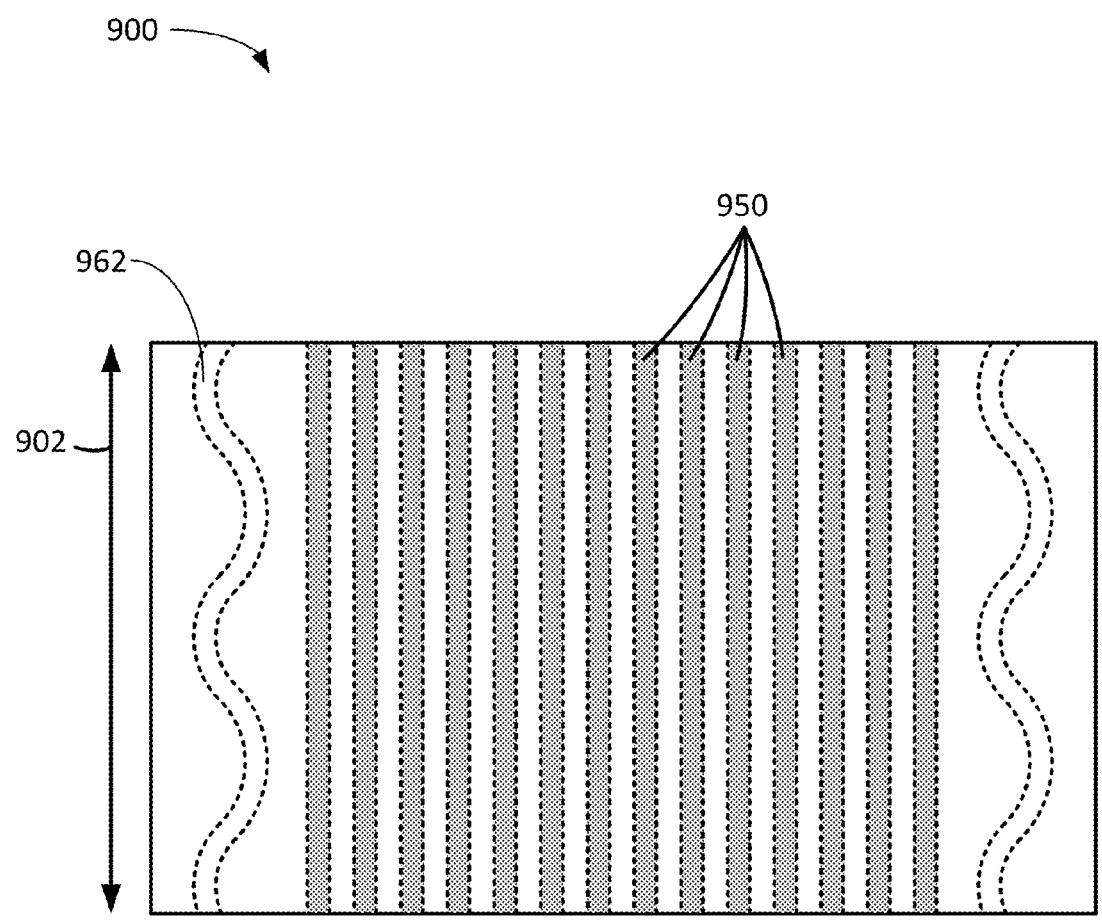
FIG. 9 is a top view of another exemplary electro-optical circuit board including one or more optical layer recesses defining a curved pattern.

Similarly, FIG. 9 illustrates one or more optical layer recesses 962 that are undulating along the longitudinal direction 902. Specifically, the one or more optical layer recesses 962 of assembly 900 define a shape along the longitudinal direction 902 that may be described as, e.g., sinusoidal, curved, radial arc s-bends (e.g., with two 90 degree bends of constant curvature but alternating signs are cascaded), cosine, etc.

Figure 10:
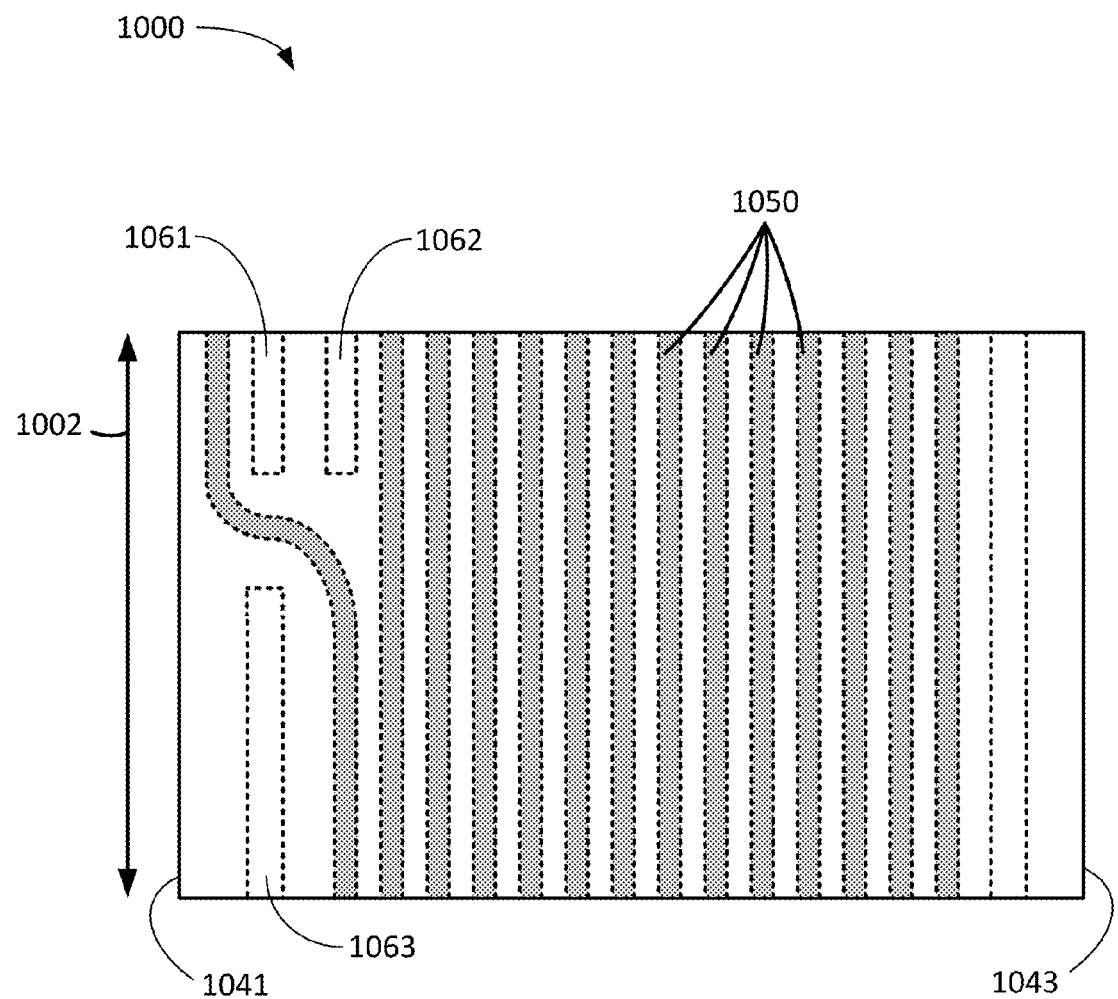
FIG. 10 is a top view of yet another exemplary electro-optical circuit board including one or more optical layer recesses.

FIG. 10 illustrates an assembly 1000 that includes discrete (e.g., broken, discontinuous, etc.) one or more optical layer recesses 1061, 1062, 1063 extending along the longitudinal direction 1002. In one or more embodiments, the one or more optical layer recesses 1061, 1062, 1063 may be, e.g., discrete elements or islands. The discrete arrangement of the one or more optical layer recesses 1061, 1062, 1063 may allow at least one of the one or more polymeric waveguide cores 1050 to extend through (e.g., cut through) the one or more optical layer recesses 1061, 1062, 1063 to, e.g., extend to a different portion of the electro-optical circuit board. In one or more embodiments, at least one of the one or more polymeric waveguide cores 1050 may extend along the longitudinal direction 1002 such that the polymeric waveguide core is positioned between the one or more optical layer recesses 1061, 1062 and the first optical layer sides 1041. Additionally, the one or more optical layer recesses 1061, 1062, 1063 may include multiple optical layer recesses that extend adjacent one another along the longitudinal direction 1002. Multiple adjacent optical layer recesses may allow the one or more optical layer recesses 1061 to better track along with the one or more polymeric waveguide cores. For example, optical layer recess 1061 may provide stress relief for the polymeric waveguide core located proximate the first optical layer side 1041, while optical layer recess 1062 may provide stress relief for the remaining one or more polymeric waveguide cores 1050.

Any recess of the one or more optical layer recesses or one or more substrate recesses may be mixed and matched with any other recess as described in FIGS. 1-10. Additionally, compliant material may be disposed in any of the recesses described in FIGS. 1-10.

Figure 11A:
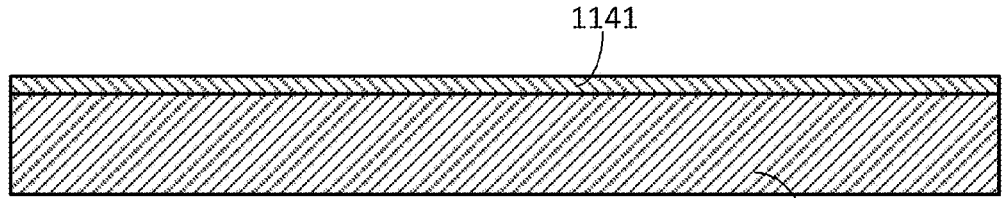
FIGS. 11A-11M is a method of manufacturing an exemplary electro-optical circuit board including one or more optical layer recesses.
Figure 11B:
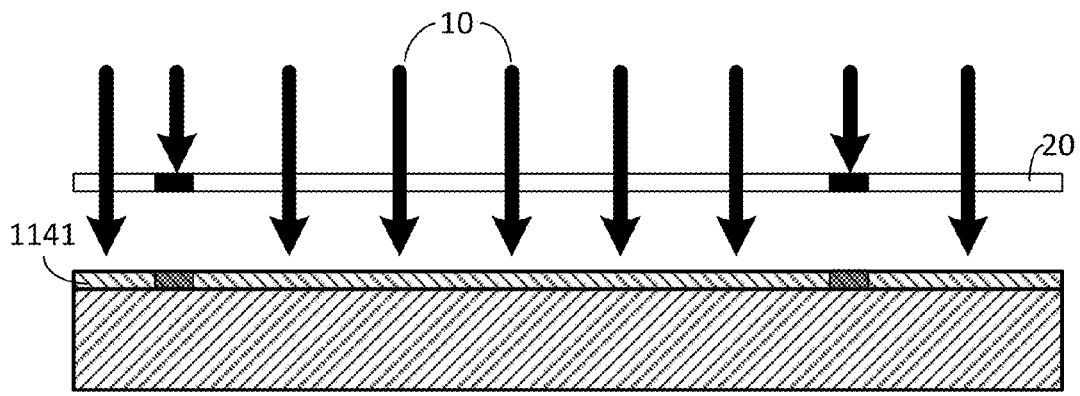
Figure 11C:
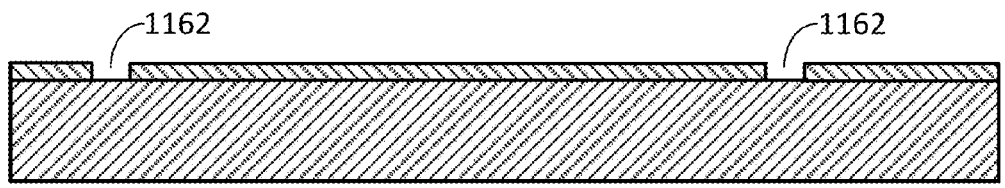
Figure 11D:
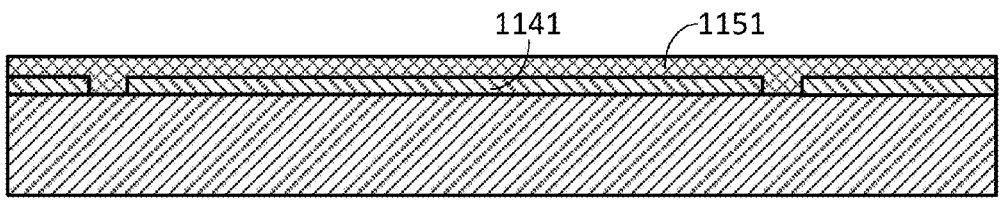
Figure 11E:
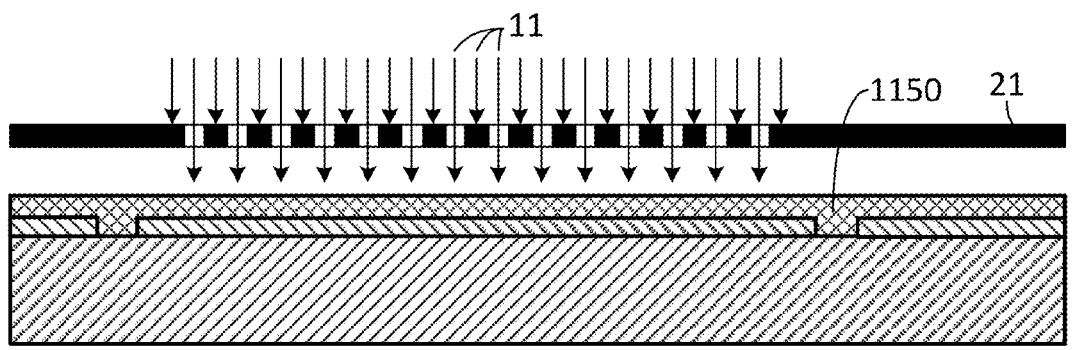
Figure 11F:
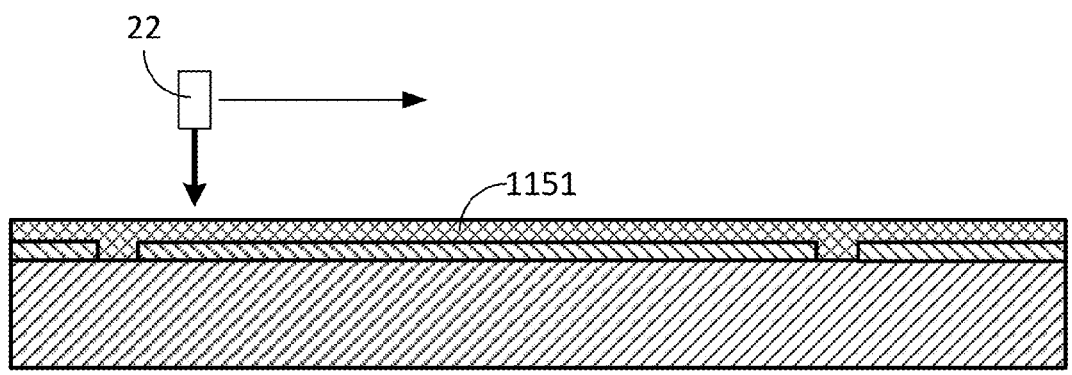
Figure 11G:
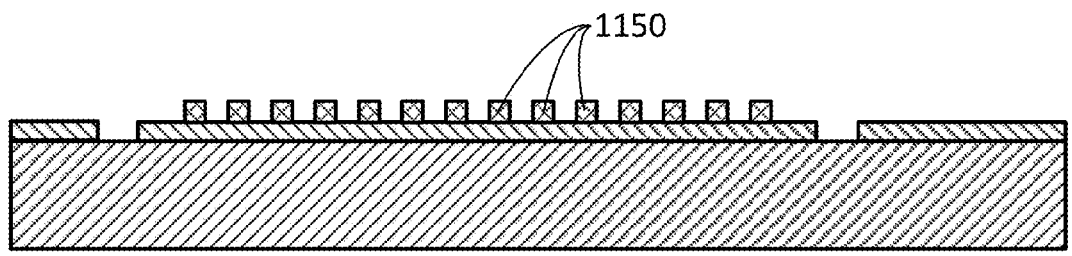

FIGS. 11A-11M illustrate a method by which an electro-optical circuit board 1100 may be formed. FIG. 11A depicts providing a first substrate 1120 and depositing (e.g., spin-coating, sputtering, etc.) a first cladding layer 1141 on the first substrate 1120. FIG. 11B then illustrates selectively curing 10 the first cladding layer 1141 with a mask 20 to reveal one or more recesses 1162 as shown in FIG. 11C. FIG. 11D depicts depositing an optical core layer 1151 on the first cladding layer 1141. FIG. 11E illustrates selectively curing 11 the optical core layer 1151 with mask 21 to form one or more polymeric waveguide cores 1150 as shown in FIG. 11G. Alternatively, FIG. 11F illustrates selectively curing the optical core layer 1151 using a curing apparatus 22 (e.g., movable UV laser aperture) that moves across the optical core layer 1151 to form one or more polymeric waveguide cores 1150 as shown in FIG. 11G. FIG. 11G also illustrates removal of the portions of the optical core layer 1151 that were not cured to reveal the one or more polymeric waveguide cores 1150.

Figure 11H:
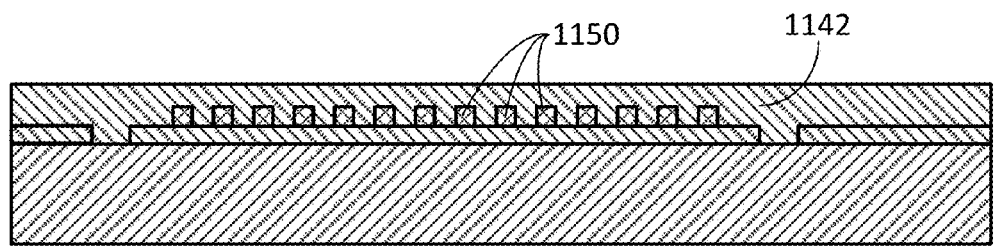
Figure 11I:
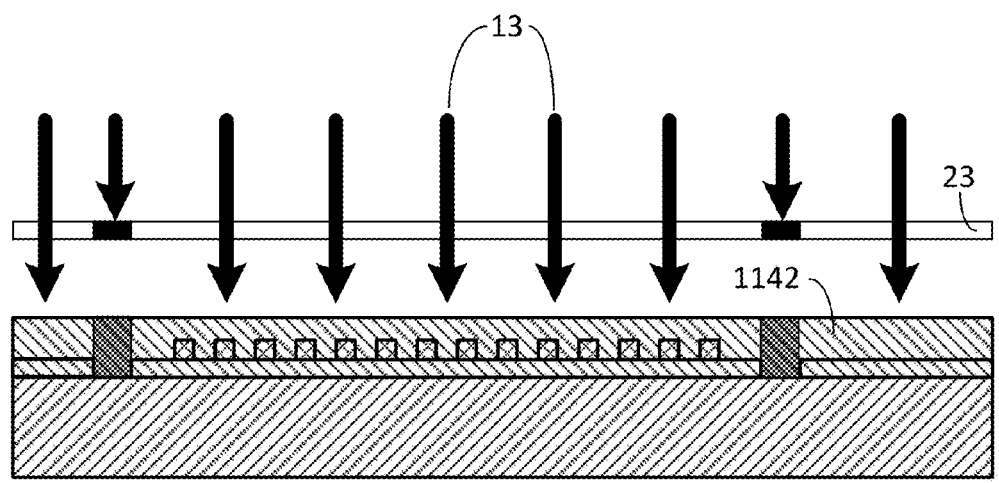
Figure 11J:
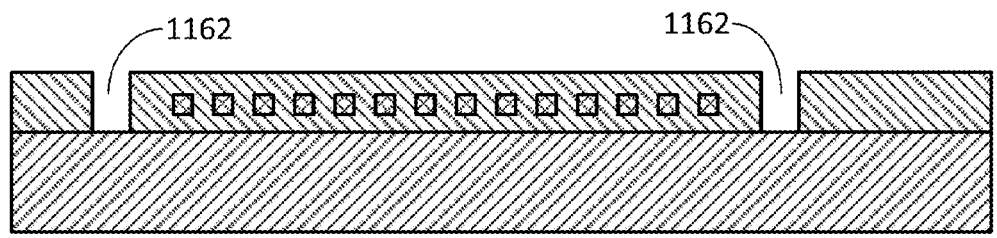
Figure 11K:
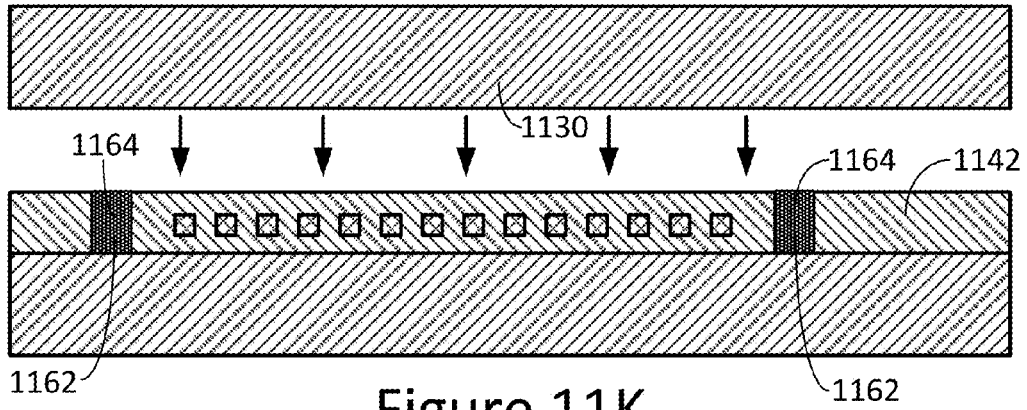

Next, FIG. 11H illustrates depositing a second cladding layer 1142 on and around the one or more polymeric waveguide cores 1150. FIG. 11I illustrates selectively curing 13 the second cladding layer 1142 with a mask 23 to reveal the one or more recesses 1162 as shown in FIG. 11J. A compliant material 1164 may then be deposited into the one or more recesses 1162 and a second substrate 1130 may be hot laminated onto the second cladding layer 1142 as shown in FIG. 11K. The hot lamination process occurs under pressure and at a temperature of, e.g., greater than or equal to 150° C., greater than or equal to 180° C., greater than or equal to 200° C., greater than or equal to 250° C., etc.

Figure 11L:
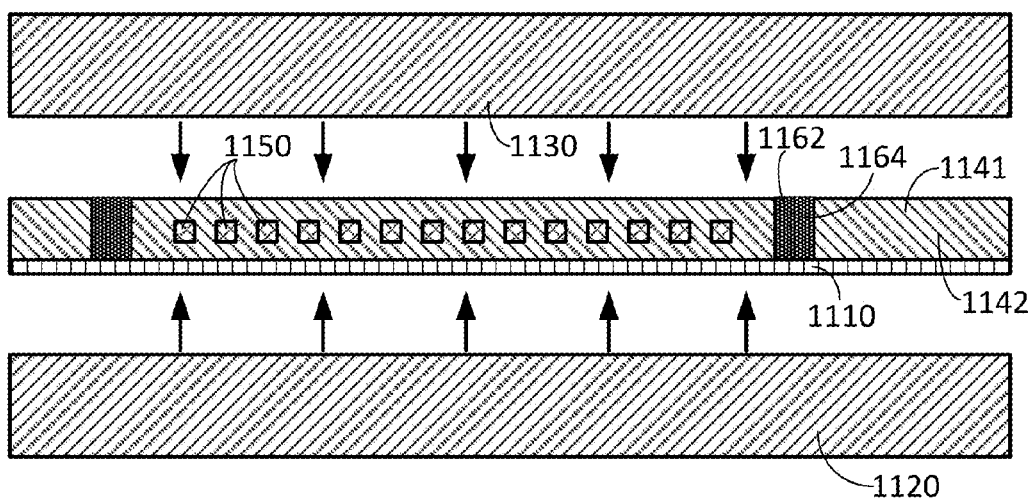
Figure 11M:
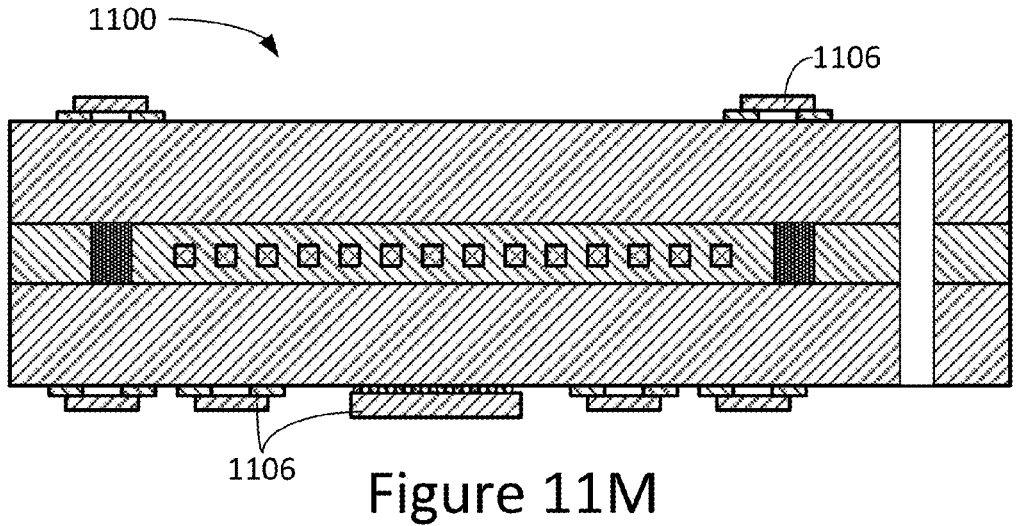

Alternatively, the optical layer 1140 may be formed on a flexible substrate 1110 and then the first and second substrates 1120, 1130 are coupled to the optical layer 1140 and flexible substrate 1110 through a hot lamination process as shown in FIG. 11L. In other words, the cladding layers 1141, 1142, waveguide core layers 1151, one or more recesses 1162, and compliant material 1164 are constructed on the flexible substrate 1110 prior to being coupled to the first and second substrates 1120, 1130. The flexible substrate 1110 may be described as positioned between the first or second substrate 1120, 1130 and the optical layer 1140. Finally, electronic components 1106 (e.g., integrated circuits, passive components, electro-mechanical components, etc.) may be assembled onto the electro-optical circuit board 1100 as shown in FIG. 11M. Assembling electronic components 1106 onto the electro-optical circuit board 1110 may include heating the electro-optical circuit board to a temperature of, e.g., greater than or equal to 150° C., greater than or equal to 200° C., greater than or equal to 250° C., greater than or equal to 300° C., etc.

Figure 12:
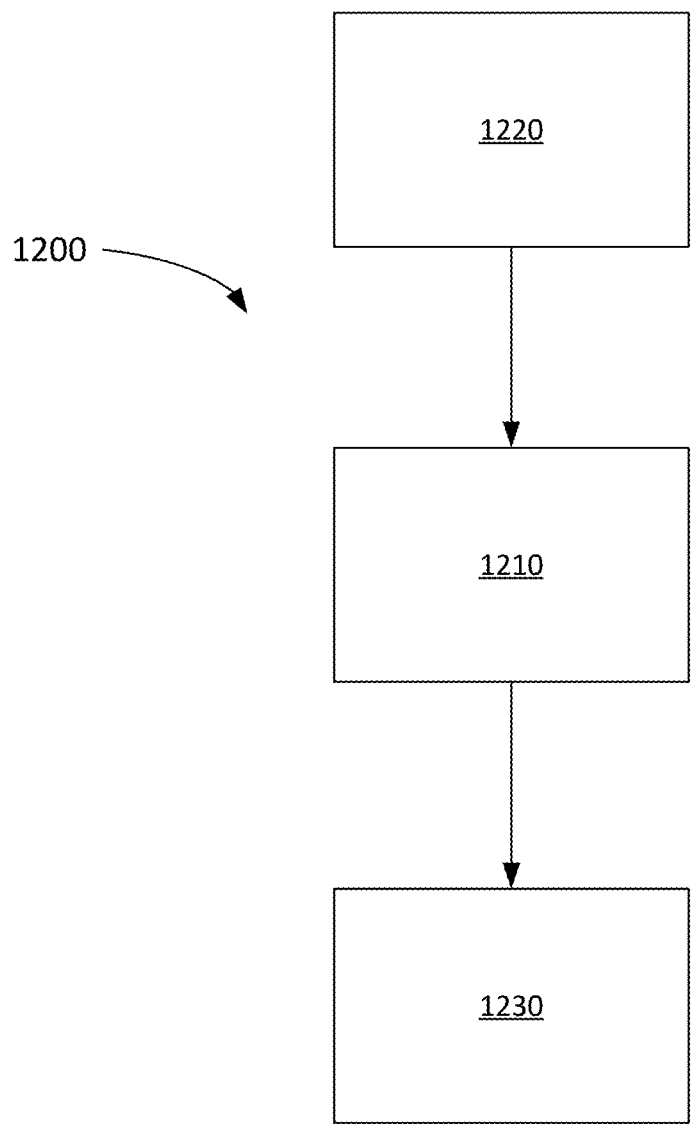
FIG. 12 is a schematic diagram of an exemplary system including an electro-optical circuit board.

FIG. 12 is a schematic diagram of an illustrative system 1200 including an electro-optical circuit board 1210 as described herein. The system 1200 may further include a storage device 1220 (e.g., a data storage device) coupled to the electro-optical circuit board 1210. Also, the system 1200 may include a computing device 1230 (e.g., processor, network, etc.) coupled to the electro-optical circuit board 1210. The arrows there between may represent signal or data transmission between the system 1200 components (e.g., the electro-optical circuit board 1210, the storage device 1220, computing device 1230).

In one or more embodiments, a method of reducing thermal expansion stress including providing an electro-optical circuit board. The electro-optical circuit board may include a first substrate, a second substrate, an optical layer, and a compliant material. The first and second substrate may extend along a longitudinal direction. The optical layer may be positioned between the first substrate and the second substrate and may define a first optical layer surface and a second optical layer surface opposing the first optical layer surface. The optical layer may include a cladding layer, one or more polymeric waveguide cores, and one or more optical layer recesses. The cladding layer may extend from the first optical layer surface to the second optical layer surface. The one or more polymeric waveguide cores may be at least partially disposed within the cladding layer and may extend along the longitudinal direction. The one or more optical layer recesses may extend into the cladding layer from the first optical layer surface or the second optical layer surface. The compliant material may have a Young's Modulus of less than 1 GPa and may be disposed within the one or more optical layer recesses. The method may also include heating the electro-optical circuit board to create thermal expansion stress within the optical layer. Further, the method may include dispersing the thermal expansion stress within the compliant material.

In one or more embodiments, a method of optical data transmission may include transmitting light through a polymeric waveguide core of an electro-optical circuit board as described herein.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

It is noted that terms such as "top", "bottom", "above, "below", etc. may be used in this disclosure. These terms should not be construed as limiting the position or orientation of a structure, but should be used as providing spatial relationship between the structures.

Embodiments of the systems, apparatus, structures, and methods for measuring coupling loss in optical waveguides are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed:

1. An electro-optical circuit board comprising:
   a first substrate and a second substrate extending along a longitudinal direction;
   an optical layer positioned between the first substrate and the second substrate and defining a first optical layer surface and a second optical layer surface opposing the first optical layer surface, the optical layer comprising:
   a cladding layer extending from the first optical layer surface to the second optical layer surface,
   one or more polymeric waveguide cores at least partially disposed within the cladding layer and extending along the longitudinal direction, and one or more optical layer recesses extending into the cladding layer from first optical layer surface or the second optical layer surface; and a compliant material disposed within the one or more optical layer recesses.

2. The electro-optical circuit board of claim 1, wherein the compliant material has a Young's modulus of less than 1 GPa.

3. The electro-optical circuit board of claim 1, wherein the optical layer defines a first optical layer side and a second optical layer side extending along the longitudinal direction, wherein the one or more polymeric waveguide cores are between the first optical layer side and the second optical layer side, wherein the one or more optical layer recesses are positioned between the first optical layer side and the one or more polymeric waveguide cores or between the second optical layer side and the one or more polymeric waveguide cores.

4. The electro-optical circuit board of claim 3, wherein the one or more optical layer recesses comprises a first optical layer recess and a second optical layer recess, wherein the first optical layer recess is positioned between the first optical layer side and the one or more polymeric waveguide cores and the second optical layer recess is positioned between the second optical layer side and the one or more polymeric waveguide cores, wherein the one or more polymeric waveguide cores separate the first optical layer recess from the second optical layer recess.

5. The electro-optical circuit board of claim 1, wherein the one or more polymeric waveguide cores define a center waveguide point that is equidistant from the first optical layer surface and the second optical layer surface, wherein at least one of the one or more optical layer recesses extends to at least the center waveguide point.

6. The electro-optical circuit board of claim 1, wherein the one or more polymeric waveguide cores comprises a single mode waveguide.

7. The electro-optical circuit board of claim 1, wherein the one or more polymeric waveguide cores comprises a multimode waveguide.

8. The electro-optical circuit board of claim 1, wherein the one or more polymeric waveguide cores comprise at least five polymeric waveguide cores, wherein the at least five polymeric waveguide cores are parallel and coextending for at least a distance along the longitudinal direction.

9. The electro-optical circuit board of claim 1, wherein the one or more optical layer recesses are coextensive with the one or more polymeric waveguide cores for at least a distance along the longitudinal direction.

10. The electro-optical circuit board of claim 1, wherein the one or more optical layer recesses form undulating shapes along the longitudinal direction.

11. The electro-optical circuit board of claim 1, wherein the one or more optical layer recesses comprise one or more discontinuous or discrete recesses positioned along the longitudinal direction.

12. The electro-optical circuit board of claim 1, wherein at least one optical layer recess of the one or more optical layer recesses extends through optical layer from the first optical layer surface to the second optical layer surface.

13. The electro-optical circuit board of claim 1, wherein each of the first substrate and the second substrate defines one or more substrate recesses extending into both the first substrate and the second substrate, wherein the compliant material is disposed in each of the one or more substrate recesses.

14. The electro-optical circuit board of claim 13, wherein the one or more substrate recesses of the first substrate align with the one or more optical layer recesses, wherein the compliant material is disposed in both of the one or more substrate recesses and the one or more optical layer recesses.

15. The electro-optical circuit board of claim 13, wherein the optical layer defines a first optical layer side and a second optical layer side, wherein the one or more polymeric waveguide cores extend a waveguide group width between the first optical layer side and the second optical layer side, wherein the one or more substrate recesses extend along the first substrate for at least a portion of the waveguide group width.

16. The electro-optical circuit board of claim 1, wherein a compliant surface of the compliant material disposed within at least one of the one or more optical layer recesses is in a plane with the first optical layer surface or the second optical layer surface.

17. The electro-optical circuit board of claim 1, further comprising a flexible substrate positioned between the second substrate and the optical layer.

18. A system comprising:
an electro-optical circuit board comprising:
a substrate defining a first substrate surface and a second substrate surface opposing the first substrate surface,
a cladding layer embedded within the substrate between the first substrate surface and the second substrate surface, the cladding layer defining a first cladding layer surface and a second cladding layer surface opposing the first cladding layer surface,
one or more polymeric waveguide cores embedded within the cladding layer, and
an expansion joint comprising a compliant material having a Young's modulus of less than 1 GPa and located in the cladding layer and extending into the first cladding layer surface or the second cladding layer surface, and a coefficient of thermal expansion of the substrate is at least $10 \times 10^{-6}$/° C. different than a coefficient of thermal expansion of the cladding layer; and
a storage device coupled to the electro-optical circuit board.

19. The system of claim 18, further comprising a computing device coupled to the electro-optical circuit board.

20. A method of reducing thermal expansion stress comprising:
providing an electro-optical circuit board, the electro-optical circuit board comprising:
a first substrate and a second substrate extending along a longitudinal direction,
an optical layer positioned between the first substrate and the second substrate and defining a first optical layer surface and a second optical layer surface opposing the first optical layer surface, the optical layer comprising:
a cladding layer extending from the first optical layer surface to the second optical layer surface,
one or more polymeric waveguide cores at least partially disposed within the cladding layer and extending along the longitudinal direction, and
one or more optical layer recesses extending into the cladding layer from the first optical layer surface or the second optical layer surface, and
a compliant material having a Young's modulus of less than 1 GPa and disposed within the one or more optical layer recesses;

heating the electro-optical circuit board to create thermal expansion stress within the optical layer; and dispersing the thermal expansion stress within the compliant material.

* * * * *